US005760655A

United States Patent [19]

Roohparvar

[11] Patent Number: 5,760,655
[45] Date of Patent: Jun. 2, 1998

[54] STABLE FREQUENCY OSCILLATOR HAVING TWO CAPACITORS THAT ARE ALTERNATELY CHARGED AND DISCHARGED

[75] Inventor: Frankie F. Roohparvar, Cupertino, Calif.

[73] Assignee: Micron Quantum Devices, Inc., Santa Clara, Calif.

[21] Appl. No.: 918,927

[22] Filed: Aug. 26, 1997

Related U.S. Application Data

[63] Continuation of Ser. No. 673,119, Jul. 1, 1996, abandoned, which is a continuation of Ser. No. 492,781, Jun. 21, 1995, abandoned.

[51] Int. Cl.$^6$ .................................................. H03K 3/0231
[52] U.S. Cl. ......................................... 331/111; 331/143
[58] Field of Search ................................. 331/111, 113 R, 331/143

[56] References Cited

U.S. PATENT DOCUMENTS

| 3,893,041 | 7/1975 | Foster et al. ....................... 331/111 |
|---|---|---|
| 4,041,333 | 8/1977 | Porat ................................. 307/279 |
| 4,309,627 | 1/1982 | Tabata ............................... 327/143 |
| 4,437,025 | 3/1984 | Liu et al. ........................... 307/475 |
| 4,584,492 | 4/1986 | Sharp ................................ 307/475 |
| 4,607,238 | 8/1986 | Kohsiek ............................. 331/143 |
| 4,658,156 | 4/1987 | Hashimoto ......................... 327/77 |
| 4,763,021 | 8/1988 | Stickel .............................. 307/475 |
| 4,922,133 | 5/1990 | Iwahashi et al. ................... 327/77 |
| 5,083,045 | 1/1992 | Yim et al. .......................... 327/80 |
| 5,097,146 | 3/1992 | Kowalski et al. .................. 327/77 |
| 5,118,968 | 6/1992 | Douglas et al. .................... 327/81 |
| 5,124,590 | 6/1992 | Liu et al. ........................... 307/473 |
| 5,155,452 | 10/1992 | Ueda et al. ........................ 331/111 |
| 5,214,320 | 5/1993 | Truong .............................. 307/443 |
| 5,233,315 | 8/1993 | Verhoeven ......................... 331/45 |
| 5,278,458 | 1/1994 | Holland et al. .................... 327/77 |
| 5,278,460 | 1/1994 | Casper .............................. 307/296 |
| 5,280,198 | 1/1994 | Almulla ............................. 327/296 |
| 5,317,532 | 5/1994 | Ochii ................................. 327/544 |
| 5,408,191 | 4/1995 | Han et al. .......................... 326/33 |
| 5,469,100 | 11/1995 | Wuidart et al. .................... 327/263 |
| 5,479,116 | 12/1995 | Sallaerts et al. ................... 326/80 |
| 5,493,235 | 2/1996 | Khayat .............................. 326/34 |

OTHER PUBLICATIONS

Pulse, Digital, and Switching Waveforms, Jacob Millman Ph.D. & Herbert Taub, Ph.D., published 1965 by McGraw-Hill, Inc.; pp. 457-460; 500-504; 514-570.

*Primary Examiner*—Siegfried H. Grimm
*Attorney, Agent, or Firm*—Schwegman, Lundberg, Woessner & Kluth, P.A.

[57] ABSTRACT

An oscillator circuit capable of being fully implemented in integrated circuit form and having a first current source for charging a first capacitor so as to produce a time varying voltage which is sensed by a first comparator when the voltage reaches a predetermined threshold level. The circuit further includes a second current source for charging a second capacitor so as to produce a further time varying voltage which is sensed by a second comparator when the voltage reaches the predetermined threshold voltage. The output of first and second comparators are combined so as to produce the output clock signal, with the first cycle segment of the clock having a duration determined by the first comparator output and the second cycle segment of the clock having a duration determined by the second comparator output.

66 Claims, 5 Drawing Sheets

STABLE FREQUENCY OSCILLATOR HAVING TWO CAPACITORS THAT ARE ALTERNATELY CHARGED AND DISCHARGED

This is a continuation of application Ser. No. 08/673,119 filed on Jul. 1, 1996, now abandoned, which is a continuation of application Ser. No. 08/492,781 filed Jun. 21, 1995 now abandoned.

BACKGROUND OF THE INVENTION

1. Field of the Invention

The present invention relates generally to oscillators and, in particular, to a voltage reference based stable frequency oscillator which can be totally implemented in integrated circuit form.

2. Description of Related Art

Many integrated circuits require a stable clock for proper operation. In typical applications, the clock is preferably generated in the integrated circuit itself by some form of an oscillator. FIG. 1 shows an exemplary integrated oscillator circuit, sometimes referred to as a ring oscillator, which provides a Clock output. The circuit includes an odd number of inverters connected in a loop including inverters 10, 12, 14, 16 and 24. Inverter 16 is a resettable inverter and includes pull-up P channel transistor 17, pull-down N channel transistor 18 and enable transistors 20 and 22.

In operation, if signal RESET is inactive (high), transistor 20 is conductive and transistor 22 is off thereby enabling inverter 16. The combination of five active inverters connected in a ring will result in oscillation. The frequency of the Clock output of inverter 24 will be determined by the sum of the delays through the five inverters.

When RESET goes active (low), transistor 22 turns on thereby pulling the input of inverter 24 to a high logic level. Pull-down transistor 18 will also remain non-conductive since transistor 20 will be turned off. When RESET then goes inactive, the input and output of inverter 16 will both initially be at a high logic level, with the output of inverter 16 immediately dropping to a low logic level. This initial transition insures that the oscillator will start up.

To change the frequency, the number of inverters can be altered or the size of the transistors which make up the inverters can be changed. In addition, capacitances can be added to the output of one or more of the inverters to increase the delay. However, the sum of the delays is inherently difficult to control, with the delays of a single inverter being a function of, for example, the trip point of the inverters and the strength of the output transistors of each inverter. The trip point is, in turn, a function of many variables, including supply voltages, temperature and processing variations. It has been found that the frequency of operation for this type of clock circuit may change from 600% to 800% when all of these variables are taken into account. Thus, the designer of the circuits which use the clock provided by this type of circuit must take this very large frequency variation into account in their design in order to insure operation under all conditions.

In addition, in many applications, a clock circuit must be capable of providing a clock having a duty cycle which approaches 50%. In other words, each clock cycle has first and second cycle segment which are of equal duration. The circuit of FIG. 1 will typically provide an output which differs significantly from 50%. It is frequently necessary to condition the clock to provide a 50% duty cycle.

This is typically done by using a toggle type flip-flop which changes state on every rising (or falling) edge of the input clock thereby producing an output clock with the desired duty cycle. However, the use of a flip-flop in this manner reduces the frequency by half. Thus, in order to provide an output clock frequency of 100 MHz, it is necessary to provide a 200 MHz input clock to the flip-flop. This places a severe restriction on the design since a 200 MHz oscillator is much more difficult to implement than a 100 MHz design, especially designs which are completely implemented in integrated circuit form.

The present invention overcomes the above-noted shortcomings of the above-described integratable clock circuit. An oscillator circuit is provided having a frequency of operation which is relatively independent of voltage, temperature and process variations. Further, the disclosed oscillator circuit need not produce a high frequency clock which must be divided by two in order to provide a 50% duty cycle. These and other advantages of the present invention will become apparent to those skilled in the art upon a reading of following Detailed Description of the Invention together with the drawings.

SUMMARY OF THE INVENTION

An oscillator circuit implemented in a single integrated circuit and producing a clock output having first and second cycle segments is disclosed. The circuit includes a first current source and a first capacitor coupled together so as to produce a first capacitor voltage which varies with time. A first comparator circuit is included for monitoring the first capacitor voltage and producing an output when the first capacitor voltage is at a predetermined first threshold voltage.

The circuit further includes a second current source and second capacitor coupled together so that the capacitor is charged by the current source so as to produce a time varying second capacitor voltage. A second comparator is provided for monitoring the second capacitor voltage and providing an output when the voltage is at a predetermined voltage. Further included is output means for combining the output of the two comparators and producing the clock output, with the first cycle segments of the clock output being determined by the first comparator output and the second cycle segments of the clock output being determined by the second comparator output. Preferably, the output means includes a logic gate for combing the two comparator outputs and a flip-flop circuit which is clocked by the gate output so that the flip-flop circuit changes state when each comparator changes state. In that event, the output clock is the output of the flip-flop.

DETAILED DESCRIPTION OF THE INVENTION

Figure 1:
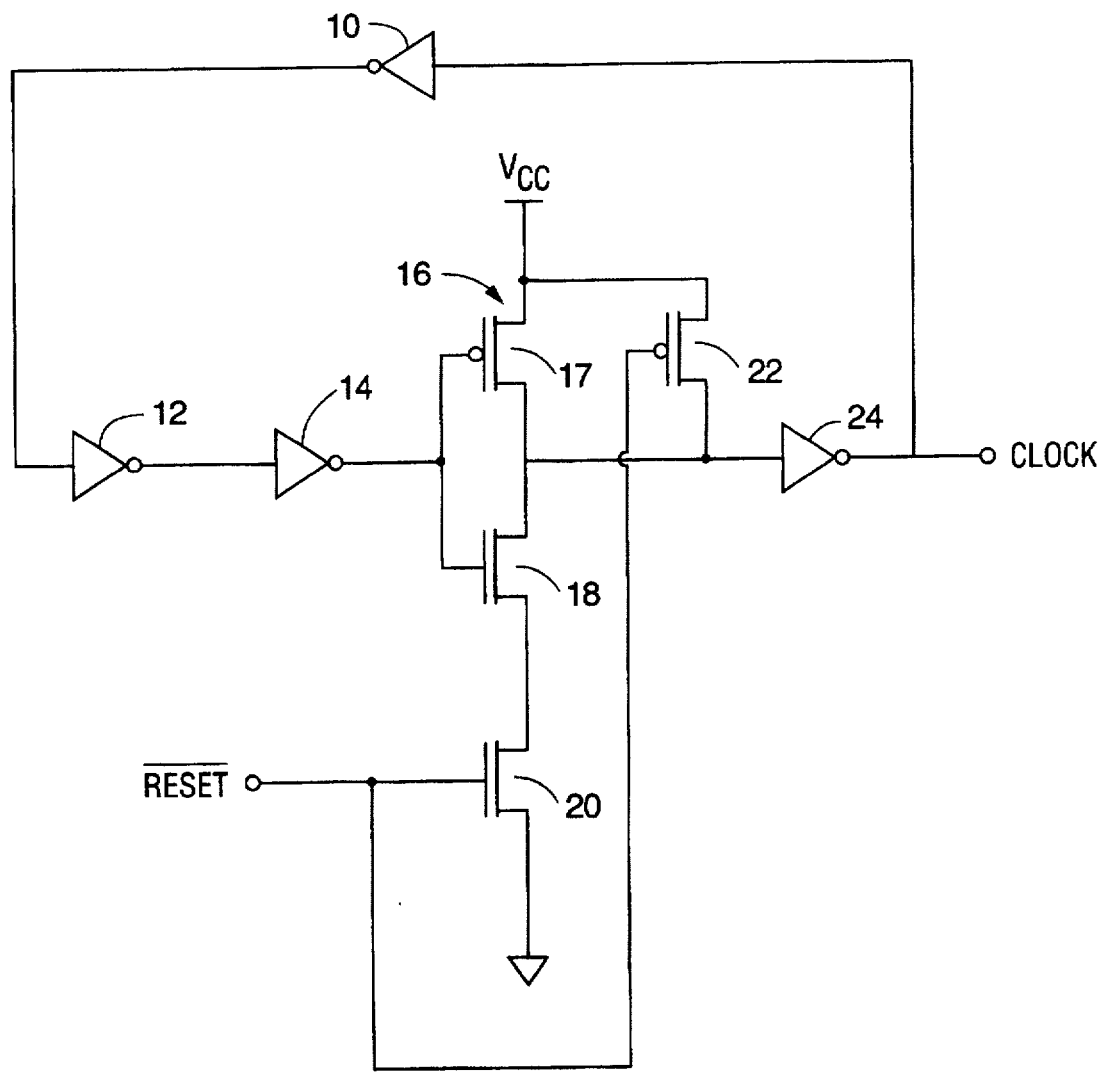
FIG. 1 is schematic diagram of a conventional oscillator capable of being fully implemented in integrated circuit form.
Figure 2:
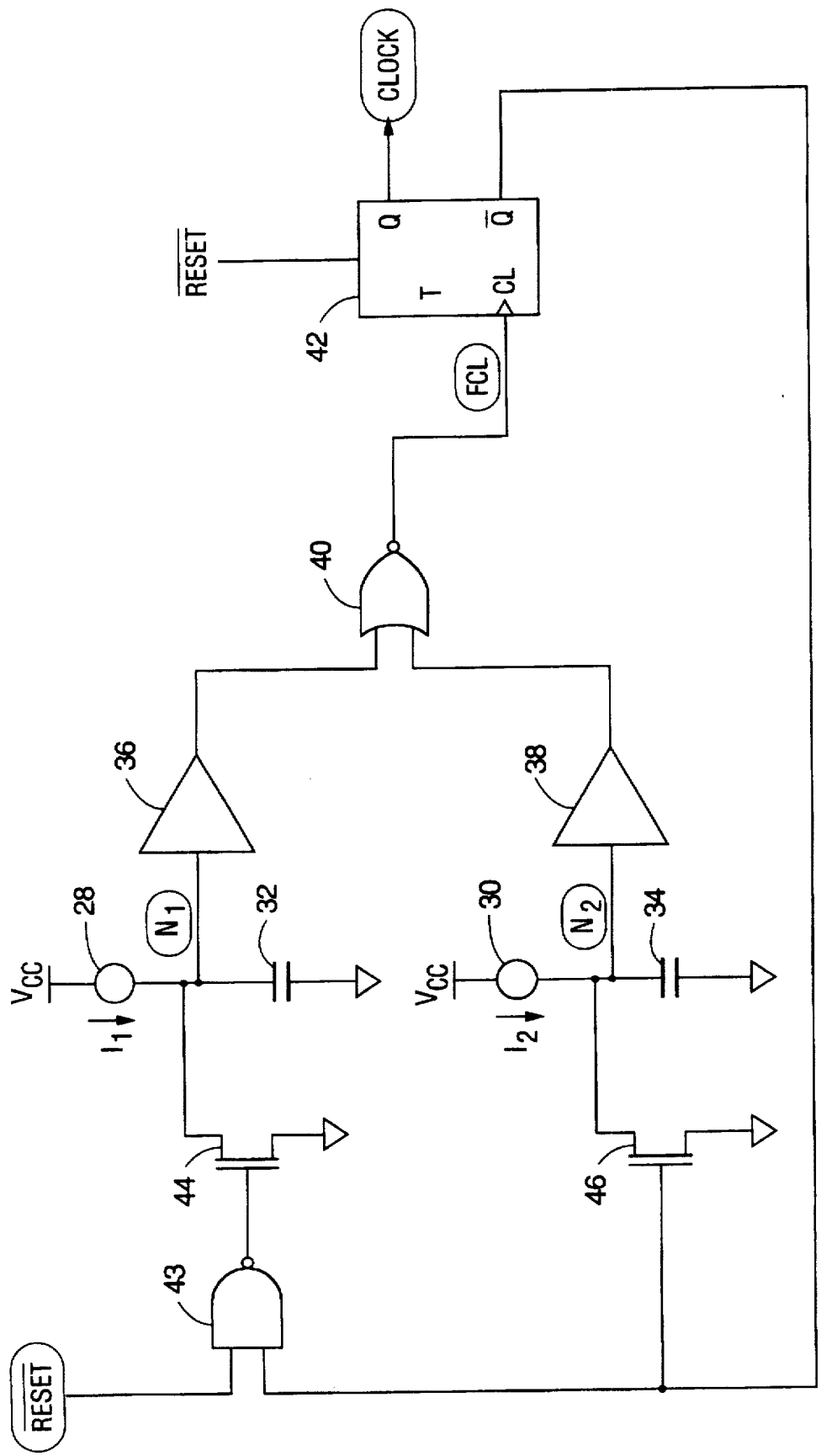
FIG. 2 is a block diagram of an oscillator in accordance with the present invention.

Referring again to the drawings, FIG. 2 shows a block diagram of the subject oscillator circuit. The oscillator includes a pair of stable current sources 28 and 30 which are connected so as to provide reference currents $I_1$ and $I_2$ to capacitors 32 and 34, respectively. Capacitors 32 and 34 may be implemented in any one of the well know methods used in MOS integrated circuits, with the actual implementation preferably providing a stable capacitance. A voltage is produced at nodes $N_1$ and $N_2$ which varies with time, as will be explained.

A pair of stable comparators 36 and 38 are connected to monitor the voltages produced across capacitors 32 and 34, respectively. The outputs of the comparators 36 and 38 are connected to the input of a two-input NOR gate 40, the output of which is connected to the clock input of a toggle flip-flop 42. The Q output of flip-flop 42 is the CLOCK output. Flip-flop 42 has a reset input which receives a signal $\overline{RESET}$.

The circuit further includes a pair of N channel transistors 44 and 46 connected so as to periodically discharge capacitors 32 and 34, respectively. The gate of transistor 46 is connected directly to the $\overline{Q}$ output of flip-flop 42 and the gate of transistor 44 is connected to the $\overline{Q}$ output by way of one input of a NAND gate 43. A second input of gate 43 is connected to receive signal $\overline{RESET}$.

Figure 3:
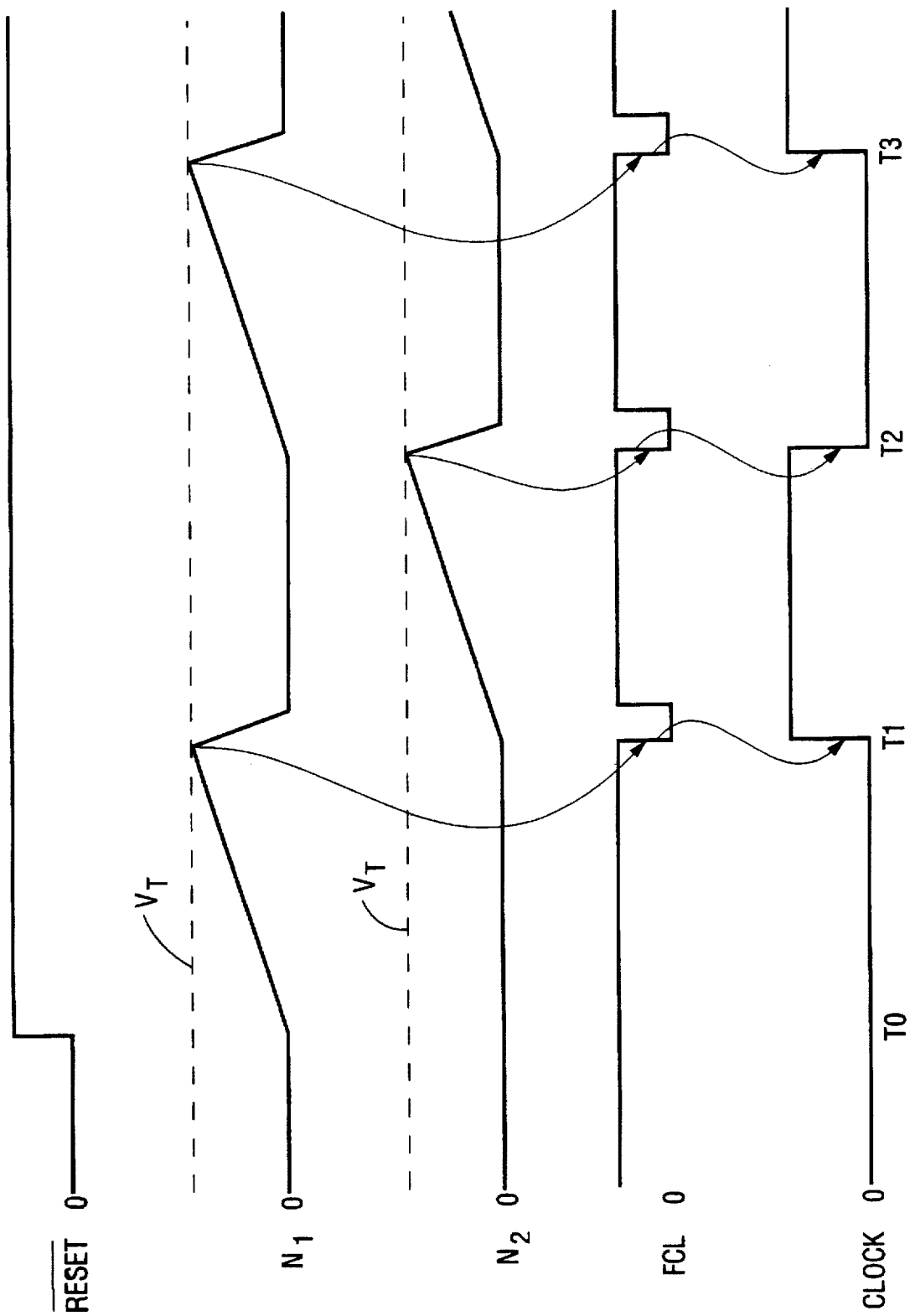
FIG. 3 is a timing diagram illustrating the operation of the FIG. 2 oscillator.

Operation of the FIG. 2 circuit will now be described in connection with the timing diagram of FIG. 3. Prior to time $T_0$, signal $\overline{RESET}$ is active (low). Thus, the Q output of flip-flop 42, CLOCK, is low and the $\overline{Q}$ output is high. The $\overline{Q}$ output causes transistor 46 to be conductive so as to maintain capacitor 34 in a fully discharged state. Signal $\overline{RESET}$ also forces the output of gate 43 to be high so that transistor 44 is also conductive so that capacitor 32 will also be discharged. Although not shown in FIG. 2, current sources 28 and 30 are also both disabled when $\overline{RESET}$ is active. Thus, as can be seen from the timing diagram of FIG. 3, the voltage at nodes $N_1$ and $N_2$ will both be at 0 volts. In addition, the outputs of comparators 36 and 38 will both be low so that the output of NOR gate 40, signal FCL, will be high.

At time $T_0$, $\overline{RESET}$ becomes inactive (high) thereby releasing toggle flip-flop 42. In addition, the current sources 28 and 30 become operative. However, the $\overline{Q}$ output of flip-flop 42 will remain high so that transistor 46 will continue to be conductive and force capacitor 34 to remain discharged. Both inputs to gate 43, including $\overline{RESET}$, will be high so that the gate of transistor 44 will go low. Thus, transistor 44 will turn off thereby permitting current source 28 to charge capacitor 32.

Since current source 28 produces a constant current, the voltage $N_1$ across capacitor 28 will increase at a linear rate, proportional to the magnitude of current $I_1$ and inversely proportional to the size of capacitor 32. As can be seen from FIG. 3, voltage $N_1$ will begin to increase at time $T_0$ and will continue until the voltage reaches a predetermined threshold voltage $V_T$. Comparator 36 is implemented, as will be described, to change state when the input reaches voltage $V_T$. At that point, time $T_1$, the output of comparator 36 goes high thereby causing the output of NOR gate 40, signal FCL, to go low.

Flip-flop 42 is implemented to change states when there is a falling edge on the input clock. Thus, the Q output of flip-flop 42 signal CLOCK goes high at time $T_1$. When flip-flop 42 changes state, transistor 44 is turned on and transistor 46 is turned off. Capacitor 32 will be discharged through transistor 44, thereby causing the output of comparator 36 to go low. This, in turn, causes signal FCL to go high again after time $T_1$. However, flip-flop 42 is only responsive to the falling edge of the input clock so there will be no change in the output of the flip flop.

Since transistor 46 is no longer conductive, current source 30 will proceed to charge capacitor 34 beginning at time $T_1$. As can be seen in FIG. 3, the voltage $N_2$ across capacitor 34 will increase at a linear rate as did voltage $N_1$. Voltage $N_2$ will increase until it reaches the predetermined threshold voltage $V_T$ at time $T_2$. At this point, the output of comparator 38 will go high thereby causing the output of NOR gate 40, signal FCL, to go low. This downward transition of FCL will cause flip-flop 42 to toggle so that output CLOCK will go low. Thus, the first cycle segment of output CLOCK, from time $T_1$ to time $T_2$ has been generated.

At this point, time $T_2$, transistor 46 will again become conductive thereby discharging capacitor 30. This will cause the output of gate 40, signal FCL, to go high. In addition, transistor 44 will again be turned off so that capacitor 32 will start to charge again at time $T_2$. Eventually, voltage $N_1$ will again reach $V_T$ at time $T_3$ thereby causing signal FCL coupled to flip-flop 42 to drop to a low level. This, in turn, causes the output CLOCK to change state. Thus, the second cycle segment of signal CLOCK is produced between time $T_2$ and $T_3$.

As can be seen from the foregoing, the time constant determined by the magnitudes of current source $I_1$, capacitor 32 and trip voltage $V_T$ determine the period of the first cycle segment of signal CLOCK. Similarly, the time constant determined by the magnitudes of current source $I_2$, capacitor 34 and trip voltage $V_T$ determine the period of the second cycle segment of signal CLOCK. Typically, the two time periods are set equal so as to produce a 50% duty cycle. However, an important aspect of the present invention is the flexibility of setting the duty cycle to essentially any desired value by adjusting the relative magnitudes of currents $I_1$ and $I_2$. As will be subsequently explained, the variables that determine the two time periods that set the duty cycle and frequency are relatively stable with respect to supply voltage, temperature and process variations.

Figure 4:
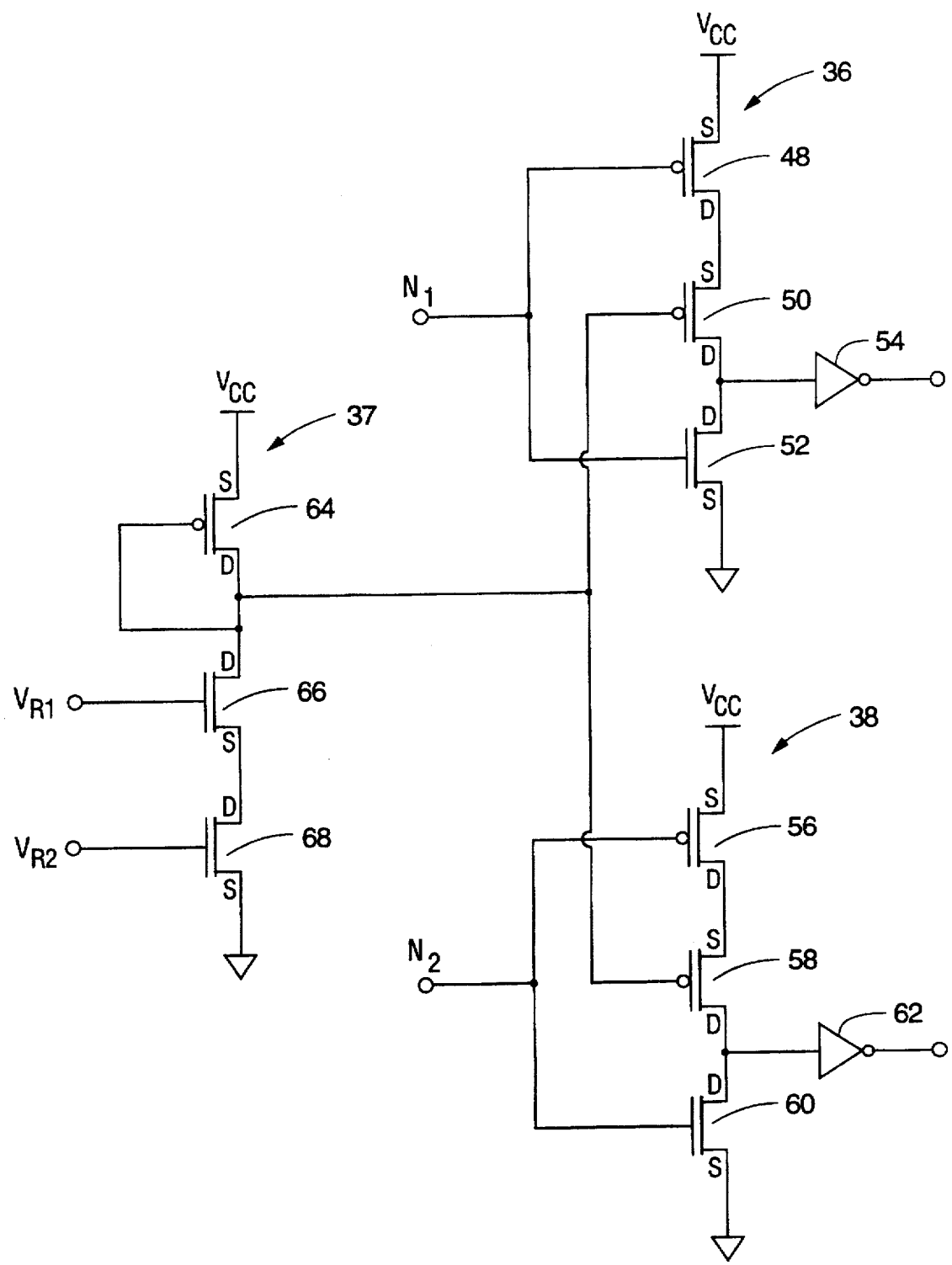
FIG. 4 is a schematic diagram of the stable comparator circuits used in the FIG. 2 oscillator design.

FIG. 4 is a more detailed schematic diagram of the two comparators 36 and 38 of FIG. 2. Both comparators share a common reference section 37. Additional details regarding the implementation and operation of the comparators 36 and 38 are set forth in a copending application naming the same inventor as the present application and entitled "CMOS BUFFER HAVING STABLE THRESHOLD VOLTAGE" filed on Jun. 21, 1995 and granted application Ser. No. 08/493,166, now U.S. Pat. No. 5,668,483. The entire contents of such co-pending application are hereby fully incorporated by reference into the present application.

Comparator 36 includes a first stage comprising three MOS transistors connected in series (the term MOS is intended to include all types of insulated gate field effect transistors). The three transistors include a P channel transistor 48 having its source connected to the positive supply voltage Vcc, a second P channel transistor 50 having its source connected to the drain of transistor 48 and its drain connected to the output of the first stage. Transistor 52 is an N channel device with its drain connected to the output of the first stage and its source connected to the circuit common. The gates of transistors 48 and 52 are connected together to form the input to the comparator. The output of the input stage of comparator 36 is connected to an inverter circuit 54, with the output of circuit 54 forming the output of the comparator.

Comparator 38 is identical to comparator 36 in construction and includes transistors 56, 58 and 60 together with an inverter circuit 62. Both comparator circuits 36 and 38 share the common reference section 37. The reference section includes three series-connected transistors 64, 66 and 68. Transistor 68, sometimes referred to as the reference transistor, is an N channel MOS device having its source connected to the circuit common and is implemented to closely match transistors 52 and 60. For reasons that will be explained, all three devices 52, 60 and 68 are located on the die in proximity to one another. A reference voltage $V_{R2}$ is connected to the gate of transistor 68 and has a magnitude equal to the predetermined trip voltage $V_T$ (FIG. 3) of comparators 36 and 38.

The second N channel transistor 66 has its source connected to the drain of transistor 68 and its gate connected to a second reference voltage $V_{R1}$ which is somewhat larger in magnitude than voltage $V_{R2}$. Voltage $V_{R1}$ is selected as is the nominal threshold voltage of transistor 66 such that the source-follower configured transistor produces a voltage at its source which is equal in magnitude to voltage $V_{R2}$. Thus, both the gate and drain of reference transistor 68 will be at the desired comparator trip voltage $V_T$.

Reference transistor 68 is thus biased so as to produce a reference current. P channel transistor 64 is connected to conduct the reference current and to mirror this current under certain operating conditions into the two comparators 36 and 38.

The two comparators are implemented to change states at the trip point of the comparator. The trip point is defined as the voltage point where the input of the comparator is equal in magnitude to the output of the comparator first stage. Thus, assuming that the trip point of comparator 36 is to be voltage $V_T$, the gate of transistor 52 will be at voltage $V_T$ as will the drain which is connected to the output of the comparator input stage. These voltages, which will be applied to transistor 52 when the comparator is at its trip point, are the same voltages applied to the reference transistor 68.

Transistor 68 of the reference section 37 is implemented to match transistor 52 of comparator 36 and transistor 60 of comparator 38. In addition, transistor 64 of the reference section 37 is implemented to match transistor 50 of comparator 36 and to match transistor 58 of comparator 38. As will be explained in greater detail, a reference current is produced in transistor 68 which will be mirrored under certain operating conditions into transistors 52 and 60 of comparators 36 and 38, respectively.

When the input $N_1$ to comparator 36 is below the threshold voltage $V_T$, transistor 52 is non-conductive and transistors 48 and 50 are conductive. Thus, the output of the input stage, the drains of devices 50 and 52 will be at a high logic level. Conductive transistor 48 will have a small drain-source voltage so that the gate-source voltage of transistor 50 will essentially be equal to the drain-source voltage of transistor 64 of the reference stage. Transistors 50 and 64 will function together as a current mirror. However, since the voltage across transistor 50 is small at this point, the transistor will be operating in the linear (resistive) mode and will not function as a current mirror which requires operation in the saturation (current source) mode.

As voltage $N_1$ increases and approaches the trip voltage, transistor 52 will start to become conductive and will proceed to sink current provided by transistor 50. This will cause the drain-source voltage of transistor 50 to increase so that the transistor starts to enter the saturation mode and operate together with transistor 64 as a current mirror. At the precise point that input voltage $N_1$ reaches $V_T$, the gate-source voltage of transistor 52 will be equal to that of reference transistor 68. In addition, the current flow through transistor 52 will be equal to the reference current conducted by reference transistor 68. Since transistors 68 and 52 are matched, the drain-source voltages of the two devices will be the same. Thus, the drain voltage of transistor 52 will be equal to the drain voltage of transistor 68, namely, voltage $V_T$.

At this point, comparator 36 is at the predetermined trip point. Both transistors 50 and 52 will be momentarily in saturation so that the voltage gain will be relatively large. Thus, a very slight additional increase in input voltage $N_1$ above voltage $V_T$ will cause the output of the buffer input stage to decrease so as to present a logic low signal to inverter circuit 54. Circuit 54 will provide additional gain and will invert the signal so that the comparator will be non-inverting. Operation of comparator 38 is the same.

The trip voltage of comparators 36 and 38 is stable over power supply variations since the trip point is determined almost exclusively by the voltages applied to the reference transistor 68. As will be explained, these voltages are derived from a conventional voltage reference, such as a band-gap reference, which is constant over temperature and supply voltage. The trip point does not vary with temperature since any change in the temperature of the reference transistor 68 which causes a change in reference current will be exactly offset by a corresponding change in temperature of transistors 52 and 60. The same is true with variations attributable to processing. Since transistors 68, 52 and 60 are located together on the die, they will be affected by process variations in the same manner so that the effects will cancel one another.

Figure 5:
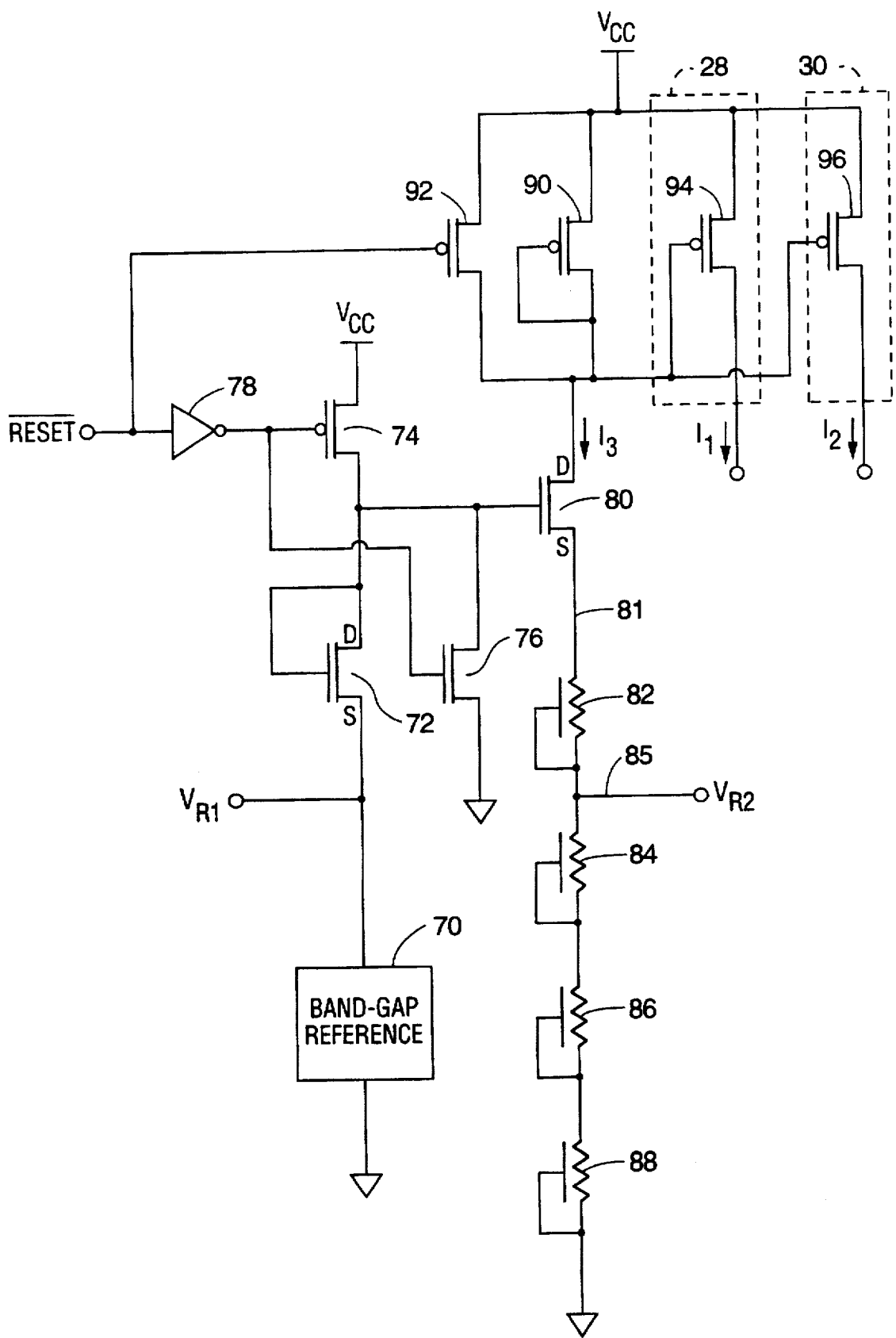
FIG. 5 is a schematic diagram of the stable current sources used in the FIG. 2 oscillator design.

The FIG. 5 schematic shows details regarding the implementation of the current sources 28 and 30 and the circuitry for generating the reference voltages $V_{R1}$ and $V_{R2}$. Reference voltage $V_{R1}$ is produced either directly or indirectly by a voltage reference circuit, such as a band-gap reference circuit 70 or other well known circuit for producing stable reference voltages. In this example, the band-gap reference 70 is implemented to provide a reference voltage $V_{R1}$ equal to trip voltage $V_T$.

The band-gap circuit 70 is biased by two series-connected transistors 72 and 74. N channel transistor 72 has its drain and gate connected together so that the voltage present at the drain is equal to the reference voltage $V_{R1}$ plus the threshold voltage of transistor 72. P channel transistor 74 and N channel transistor 76 are control transistors, with both having their gates connected to the output of inverter 78. Inverter 78 receives signal $\overline{\text{RESET}}$ so that when the signal is active (low), transistor 74 is off thereby disconnecting transistor 72 and the band-gap reference 70 from the supply voltage Vcc. In addition, transistor 76 is turned on thereby effectively grounding the drain of transistor 72.

The circuit further includes a second N channel transistor 80 which is matched to transistor 72. A group of series-connected resistors 82, 84, 86 and 88 are connected between the source of transistor 80 and the circuit common. The voltage at the source of transistor 80, node 81, will be one threshold voltage drop below the gate voltage of the transistor which is, in turn, one threshold voltage drop above voltage $V_{R1}$. Thus, the voltage at node 81 will be equal to voltage $V_{R1}$.

The sum of the resistances of the resistors 82, 84, 86 and 88 are selected so that a predetermined current $I_3$ flows through the resistors. Typically, the magnitude of current $I_3$ will be equal to the desired magnitude of currents $I_1$ and $I_2$ of current sources 28 and 30, respectively. In addition, the value of the resistances are selected so that a voltage divider is produced which produces voltage $V_{R2}$ at node 85. This voltage should be equal to the desired trip voltage of comparators 36 and 38.

Since voltage $V_{R2}$ is derived from voltage $V_{R1}$ utilizing a resistive divider, variations of the values of resistances that make up the divider offset one another. However, variations of the resistances 82, 84, 86 and 88 due to temperature and processing will cause the magnitude of current $I_3$ to change. In order to reduce this effect, these resistors can each be implemented using different processing layers having opposite temperature coefficients so that the total resistance remains more stable. Further, resistors 86 and 88 can be implemented as small trim resistors which can be selectively removed by metal shorts in order to permit the magnitude of current $I_3$ to be more precisely controlled.

The FIG. 5 circuit further includes four P channel transistors 90, 92, 94 and 96. Transistor 92 is a control transistor which is conductive so as to disable the remaining transistors 90, 94 and 96 when signal $\overline{RESET}$ is active. When signal $\overline{RESET}$ is not active, transistor 92 is off so that transistor 90 conducts all of current $I_3$. Transistor 90 functions as the input side of a current mirror, with transistors 94 and 96 functioning as the two output sides. Assuming that transistors 90, 94 and 96 are matched, currents $I_1$ and $I_2$ will be equal to current $I_3$. The magnitude of current $I_3$ is essentially independent of variations in the supply voltage therefore currents $I_1$ and $I_2$ will also be stable. The geometry of transistors 94 and 96 can be modified, as is well known in the art, to provide current outputs $I_1$ and $I_2$ that differ in magnitude from one another and from current $I_3$ so as to provide different CLOCK duty cycles.

Signal $\overline{RESET}$ functions to not only insure reliable start up of the oscillator, but also functions to initialize the toggle flip-flop 42 and to reduce power consumption when the current sources 28 and 32 are disabled.

It is important to note that all of the components of the subject oscillator circuit are readily implemented in integrated circuit form. In addition, it can be seen from the foregoing that the variables that control the frequency of signal CLOCK—the magnitude of the currents $I_1$ and $I_2$, the magnitude of capacitors 32 and 34 and the trip point $V_T$ of comparators 36 and 38 are stable with respect to the supply voltage, temperature and process variations.

Thus, a novel reference voltage based oscillator has been described. Although one embodiment has been described in some detail, certain changes can be made without departing from the spirit and scope of the invention as defined by the appended claims.

I claim:

1. A method of producing a clock output having first and second cycle segments comprising the following steps:
   generating a first constant current;
   charging a first capacitor with the first current so as to produce a first capacitor voltage which varies linearly with time;
   generating a second constant current, separate from the first current;
   charging a second capacitor with the second current so as to produce a second capacitor voltage which varies linearly with time;
   generating a first output signal when the first capacitor voltage is at a predetermined first threshold voltage;
   generating a second output signal when the second capacitor voltage is at a predetermined second threshold voltage; and
   producing the clock output from the first and second output signals, with the first cycle segment of the clock output having a duration determined by the first output signal and with the second cycle segment of the clock output having a duration determined by the second output signal.

2. The method of claim 1 wherein the step of producing the clock output comprises the steps of providing a latch circuit and changing a state of the latch circuit in response to the first and second output signals.

3. The method of claim 2 wherein the latch circuit comprises a toggle type flip-flop.

4. The method of claim 3 wherein the clock output is produced utilizing an oscillator circuit which includes the first and second capacitors and wherein the step of generating the first output signal comprises the step of generating a first reference voltage having a magnitude which is relatively independent of a primary supply voltage used to power the oscillator circuit and the step of deriving the first threshold voltage from the first reference voltage.

5. The method of claim 4 wherein the step of generating the second output signal comprises the step of deriving the second threshold voltage from the first reference voltage.

6. The method of claim 5 wherein the step of generating the first current comprises the step of controlling a magnitude of the first current based upon the magnitude of the first reference voltage.

7. The method of claim 6 wherein the step of generating the second current comprises the step of controlling a magnitude of the second current based upon the magnitude of the first reference voltage.

8. A method of producing a clock output having first and second cycle segments comprising the following steps:
   generating a first time varying linear signal;
   generating a first output signal which changes state based upon a relative magnitude of the first time varying linear signal and a first threshold voltage;
   generating a second time varying linear signal;
   generating a second output signal which changes state based upon a relative magnitude of the second time varying linear signal and a second threshold voltage;
   combining the first and second output signals into a single combined signal;
   producing the clock output from the combined signal, with the first cycle segment of the clock output having a duration determined by the first output signal and with the second cycle segment of the clock output having a duration determined by the second output signal.

9. The method of claim 8 wherein the step of generating the first output signal comprises the step of comparing the first time varying linear signal with the first threshold voltage using a first comparator, with the first comparator comprising first, second and third transistors connected in series, with the first and third transistors having gates connected to receive the first time varying linear signal.

10. The method of claim 9 wherein the step of generating the second output signal comprises the step of comparing the second time varying linear signal with the second threshold voltage using a second comparator, with the second comparator comprising first, second and third transistors connected in series, with the first and third transistors having gate terminals connected to receive the second time varying linear signal.

11. The method of claim 10 wherein the step of comparing the first time varying linear signal comprises the steps of providing a current mirror input transistor and coupling gate-source terminals of the current mirror input transistor to a gate terminal of the second transistor of the first comparator.

12. The method of claim 11 wherein the step of comparing the second time varying linear signal comprises the step of coupling gate-source terminals of the current mirror input transistor to a gate terminal of the second transistor of the second comparator.

13. The method of claim 12 further including the step of generating a reference current in the current mirror input transistor.

14. The method of claim 13 wherein the step of generating a reference current comprises the steps of connecting a reference transistor in series with the current mirror input transistor and applying a reference voltage equal in magnitude to the first threshold voltage across gate-source terminals of the reference transistor.

15. The method of claim 14 wherein the first and second threshold voltages are of equal magnitude.

16. An oscillator circuit implemented in a single integrated circuit and producing a clock output having first and second cycle segments, said oscillator circuit comprising:
a first constant current source which produces a first current;
a first capacitor coupled to the first current source so as to be charged by said first current thereby producing a first capacitor voltage which varies linearly with time;
a first comparator circuit which monitors the first capacitor voltage and generates a first output when the first capacitor voltage is at a predetermined first threshold voltage;
a second constant current source, separate from the first current source, which produces a second current;
a second capacitor coupled to the second current source so as to be charged by said second current thereby producing a second capacitor voltage which varies linearly with time;
a second comparator circuit which monitors the second capacitor voltage and generates a second output when the second capacitor voltage is at a predetermined second threshold voltage; and
output logic circuitry operably coupled to the first and second comparator circuits and configured to combine the first and second comparator outputs so as to produce the clock output, with the first cycle segment of the clock output having a duration determined by the first comparator output and the second cycle segment of the clock output having a duration determined by the second comparator output.

17. The oscillator circuit of claim 16 wherein the output logic circuitry comprises a latch circuit having a latch circuit output which changes from a first state to a second state when the first comparator output chances state and which changes state from the second state to the first state when the second comparator output changes state.

18. The oscillator circuit of claim 17 wherein the latch circuit comprises a toggle type flip-flop circuit.

19. The oscillator circuit of claim 16 further comprising a power bus for receiving at least one primary voltage for powering the oscillator circuit and a first reference voltage source which produces a first reference voltage, with the first reference voltage having a magnitude which is relatively independent of the primary voltage, and with the first and second comparator circuits utilizing the first reference voltage for determining when the first and second capacitor voltages are at the respective first and second threshold voltages.

20. The oscillator circuit of claim 19 wherein the first and second current sources utilize the first reference voltage for determining the first and second current magnitudes.

21. The oscillator circuit of claim 20 wherein the first and second comparator circuits each comprise input stages, with the input stages each comprising first, second and third transistors, with the transistors being connected in series and with the first transistor being an N channel transistor and the second and third transistors being P channel transistors and with the first and third transistors having gates coupled together to form an input of the input stage and with the first and second transistors having drains coupled together to form an output of the input stage.

22. The oscillator circuit of claim 21 further including a reference circuit operably coupled to the second transistor of the first comparator circuit and configured to cause the first transistor of the first comparator circuit to conduct a predetermined first reference current when the first capacitor voltage is at the predetermined first threshold voltage.

23. The oscillator circuit of claim 22 wherein the reference circuit is operably coupled to the second transistor of the second comparator circuit and configured to cause the first transistor of the second comparator circuit to conduct a predetermined second reference current when the second capacitor voltage is at the predetermined second threshold voltage.

24. The oscillator circuit of claim 22 wherein the reference circuit comprises a fourth transistor, with the fourth transistor being a P channel transistor coupled with respect to the second transistor of the first comparator circuit so as to form a current mirror circuit.

25. The oscillator circuit of claim 24 wherein the reference circuit comprises a reference transistor, with the reference transistor being an N channel transistor which is biased so as to conduct a predetermined third reference current and which is connected with respect to the fourth transistor so that the fourth transistor conducts the third reference current.

26. The oscillator circuit of claim 25 wherein the reference transistor is matched with respect to the first transistor of the first comparator circuit.

27. The oscillator circuit of claim 26 wherein the first and third reference currents are equal.

28. The oscillator circuit of claim 27 wherein the reference circuit is coupled to the second transistor of the second comparator circuit so as to cause the first transistor of the second comparator circuit to conduct a second reference current when the second capacitor voltage is at the second threshold voltage.

29. The oscillator circuit of claim 28 wherein the fourth transistor is coupled with respect to the second transistor of the second comparator circuit so as to form a current mirror circuit.

30. The oscillator circuit of claim 29 wherein the first, second and third reference currents are equal.

31. An oscillator circuit implemented in a single integrated circuit and producing a clock output having first and second cycle segments, said oscillator circuit comprising:
a first signal generator which generates a first linear time varying signal;
a second signal generator which generates a second linear time varying signal;
a first comparator circuit coupled to receive the first linear time varying signal and producing an output having a state indicative of relative magnitudes of the first linear time varying signal and a first threshold voltage;
a second comparator circuit coupled to receive the second linear time varying signal and producing an output having a state which is indicative of relative magnitudes of the second linear time varying signal and a second threshold voltage; and output circuitry operably coupled to the first and second comparator circuits and configured to combine the first and second comparator outputs so as to produce a combined signal, with the output circuitry comprising a latch circuit configured to change state when an input to the latch circuit chances state, with the input of the latch circuit receiving the combined signal and with an output of the latch circuit providing the clock output.

32. The oscillator circuit of claim 31 wherein the output circuitry produces the clock output having a first cycle segment duration determined by the first comparator circuit output and having a second cycle segment duration determined by the second comparator circuit output.

33. The oscillator circuit of claim 31 wherein the first and second signal generators comprise first and second separate current sources, respectively, with the first and second current sources producing currents having a magnitude determined by a magnitude of a common reference current.

34. The oscillator circuit of claim 33 wherein the magnitude of the common reference current is controlled by a magnitude of a common reference voltage.

35. The oscillator circuit of claim 34 wherein magnitudes of the first and second threshold voltages are controlled by the magnitude of the reference voltage.

36. An oscillator circuit which produces a clock output having first and second cycle segments, said oscillator circuit comprising:

a first signal generator which generates a first linear time varying signal;

a second signal generator which generates a second linear time varying signal;

a first comparator circuit coupled to receive the first linear time varying signal and producing an output having a state indicative of relative magnitudes of the first linear time varying signal and a first threshold voltage;

a second comparator circuit coupled to receive the second linear time varying signal and producing an output having a state which is indicative of relative magnitudes of the second linear time varying signal and a second threshold voltage;

a current control circuit operably coupled to the first and second comparator circuits and configured to control a magnitude of current flow in the first and second comparator circuits when the first and second comparator circuits change state, with the first and second comparator circuits each comprising first, second and third transistors connected in series, with the first and third transistors having gate terminals coupled to an input of the respective comparator circuits; and output circuitry operably coupled to the first and second comparator circuits and configured to combine the first and second comparator outputs in order to produce the clock output.

37. The oscillator circuit of claim 36 wherein the second transistors comprise gate terminals coupled to the current control circuit.

38. The oscillator circuit of claim 37 wherein the current control circuit comprises a fourth transistor having gate-source terminals coupled to the gate terminals of the second transistors of the first and second comparator circuits.

39. The oscillator circuit of claim 38 wherein the current control circuit comprises a reference transistor connected in series with the fourth transistor, with the reference transistor having a gate terminal coupled to a first reference voltage source which produces a first reference voltage having a magnitude equal to a magnitude of the first and second threshold voltages.

40. An oscillator circuit which produces a clock output having first and second cycle segments, said oscillator circuit comprising:

a first current source which produces a first current;

a first capacitor coupled to the first current source so as to be charged by said first current thereby producing a first capacitor voltage which varies with time;

a first discharge circuit configured to discharge the first capacitor when the first discharge circuit is in a discharge state;

a first comparator circuit which monitors the first capacitor voltage and generates a first output when the first capacitor voltage is at a predetermined first threshold voltage;

a second current source which produces a second current;

a second capacitor coupled to the second current source so as to be charged by said second current thereby producing a second capacitor voltage which varies with time;

a second discharge circuit configured to discharge the second capacitor when the second discharge circuit is in a discharge state;

a second comparator circuit which monitors the second capacitor voltage and generates a second output when the second capacitor voltage is at a predetermined second threshold voltage;

output logic circuitry operably coupled to the first and second comparator circuits and configured to combine the first and second comparator outputs so as to produce the clock output, with the first cycle segment of the clock output having a duration determined by the first comparator output and the second cycle segment of the clock output having a duration determined by the second comparator output; and discharge control circuitry responsive to the output logic circuitry and configured to force at least one of the first and second discharge circuits to be in the discharge state.

41. The circuit of claim 40 wherein the output circuitry comprises a latch.

42. An oscillator circuit implemented in a single integrated circuit and producing a clock output having first and second cycle segments, said oscillator circuit comprising:

a first current source which produces a first current;

a first capacitor coupled to the first current source so as to be charged by said first current thereby producing a first capacitor voltage which varies with time;

a first comparator circuit which monitors the first capacitor voltage and generates a first output when the first capacitor voltage is at a predetermined first threshold voltage;

a second current source, separate from the first current source, which produces a second current;

a second capacitor coupled to the second current source so as to be charged by said second current thereby producing a second capacitor voltage which varies with time;

a second comparator circuit which monitors the second capacitor voltage and generates a second output when the second capacitor voltage is at a predetermined second threshold voltage; and output logic circuitry operably coupled to the first and second comparator circuits and configured to combine the first and second comparator outputs so as to produce the clock output, with the first cycle segment of the clock output having a duration determined by the first comparator output and the second cycle segment of the clock output having a duration determined by the second comparator output, wherein the output logic circuitry comprises a toggle flip-flop circuit having a flip-flop output which changes from a first state to a second state when the first comparator output changes state and which changes from the second state to the first state when the second comparator output changes state.

43. An oscillator circuit implemented in a single integrated circuit and producing a clock output having first and second cycle segments, said oscillator circuit comprising:

a first current source which produces a first current;

a first capacitor coupled to the first current source so as to be charged by said first current thereby producing a first capacitor voltage which varies with time;

a first comparator circuit which monitors the first capacitor voltage and generates a first output when the first capacitor voltage is at a predetermined first threshold voltage;

a second current source, separate from the first current source, which produces a second current;

a second capacitor coupled to the second current source so as to be charged by said second current thereby producing a second capacitor voltage which varies with time;

a second comparator circuit which monitors the second capacitor voltage and generates a second output when the second capacitor voltage is at a predetermined second threshold voltage;

output logic circuitry operably coupled to the first and second comparator circuits and configured to combine the first and second comparator outputs so as to produce the clock output, with the first cycle segment of the clock output having a duration determined by the first comparator output and the second cycle segment of the clock output having a duration determined by the second comparator output;

a power bus for receiving at least one primary voltage for powering the oscillator circuit; and a first reference voltage source which produces a first reference voltage, with the first reference voltage having a magnitude which is relatively independent of the primary voltage, and with the first and second comparator circuits utilizing the first reference voltage for determining when the first and second capacitor voltages are at the respective first and second threshold voltages.

44. The oscillator circuit of claim 43 wherein the first and second current sources utilize the first reference voltage for determining the first and second current magnitudes.

45. The oscillator circuit of claim 44 wherein the first and second comparator circuits each comprise input stages, with the input stages each comprising first, second and third transistors, with the transistors being connected in series and with the first transistor being an N channel transistor and the second and third transistors being P channel transistors and with the first and third transistors having gates coupled together to form an input of the input stage and with the first and second transistors having drains coupled together to form an output of the input stage.

46. The oscillator circuit of claim 45 further including a reference circuit operably coupled to the second transistor of the first comparator circuit and configured to cause the first transistor of the first comparator circuit to conduct a predetermined first reference current when the first capacitor voltage is at the predetermined first threshold voltage.

47. The oscillator circuit of claim 46 wherein the reference circuit is operably coupled to the second transistor of the second comparator circuit and configured to cause the first transistor of the second comparator circuit to conduct a predetermined second reference current when the second capacitor voltage is at the predetermined second threshold voltage.

48. The oscillator circuit of claim 46 wherein the reference circuit comprises a fourth transistor, with the fourth transistor being a P channel transistor coupled with respect to the second transistor of the first comparator circuit so as to form a current mirror circuit.

49. The oscillator circuit of claim 48 wherein the reference circuit comprises a reference transistor, with the reference transistor being an N channel transistor which is biased so as to conduct a predetermined third reference current and which is connected with respect to the fourth transistor so that the fourth transistor conducts the third reference current.

50. The oscillator circuit of claim 49 wherein the reference transistor is matched with respect to the first transistor of the first comparator circuit.

51. The oscillator circuit of claim 50 wherein the first and third reference currents are equal.

52. The oscillator circuit of claim 51 wherein the reference circuit is coupled to the second transistor of the second comparator circuit so as to cause the first transistor of the second comparator circuit to conduct a second reference current when the second capacitor voltage is at the second threshold voltage.

53. The oscillator circuit of claim 52 wherein the fourth transistor is coupled with respect to the second transistor of the second comparator circuit so as to form a current mirror circuit.

54. The oscillator circuit of claim 53 wherein the first, second and third reference currents are equal.

55. A method of producing a clock output having first and second cycle segments comprising the following steps:

generating a first current;

charging a first capacitor with the first current so as to produce a first capacitor voltage which varies with time;

generating a second current, separate from the first current;

charging a second capacitor with the second current so as to produce a second capacitor voltage which varies with time;

generating a first output signal when the first capacitor voltage is at a predetermined first threshold voltage;

generating a second output signal when the second capacitor voltage is at a predetermined second threshold voltage;

providing a toggle type flip-flop circuit; and producing the clock output from the first and second output signals by changing a state of the flip-flop circuit in response to the first and second output signals, with the first cycle segment of the clock output having a duration determined by the first output signal and with the second cycle segment of the clock output having a duration determined by the second output signal.

56. The method of claim 55 wherein the clock output is produced utilizing an oscillator circuit which includes the first and second capacitors and wherein the step of generating the first output signal comprises the step of generating a first reference voltage having a magnitude which is relatively independent of a primary supply voltage used to power the oscillator circuit and the step of deriving the first threshold voltage from the first reference voltage.

57. The method of claim 56 wherein the step of generating the second output signal comprises the step of deriving the second threshold voltage from the first reference voltage.

58. The method of claim 57 wherein the step of generating the first current comprises the step of controlling a magnitude of the first current based upon the magnitude of the first reference voltage.

59. The method of claim 58 wherein the step of generating the second current comprises the step of controlling a magnitude of the second current based upon the magnitude of the first reference voltage.

60. A method of producing a clock output having first and second cycle segments comprising the following steps:

generating a first time varying linear signal;

generating a first output signal which changes state based upon a relative magnitude of the first time varying linear signal and a first threshold voltage by comparing the first time varying linear signal with the first threshold voltage using a first comparator, with the first comparator comprising first, second and third transistors connected in series, with the first and third transistors having gates connected to receive the first time varying linear signal;

generating a second time varying linear signal;

generating a second output signal which changes state based upon a relative magnitude of the second time varying linear signal and a second threshold voltage;

combining the first and second output signals into a single combined signal;

producing the clock output from the combined signal, with the first cycle segment of the clock output having a duration determined by the first output signal and with the second cycle segment of the clock output having a duration determined by the second output signal.

61. The method of claim 60 wherein the step of generating the second output signal comprises the step of comparing the second time varying linear signal with the second threshold voltage using a second comparator, with the second comparator comprising first, second and third transistors connected in series, with the first and third transistors having gate terminals connected to receive the second time varying linear signal.

62. The method of claim 61 wherein the step of comparing the first time varying linear signal comprises the steps of providing a current mirror input transistor and coupling gate-source terminals of the current mirror input transistor to a gate terminal of the second transistor of the first comparator.

63. The method of claim 62 wherein the step of comparing the second time varying linear signal comprises the step of coupling gate-source terminals of the current mirror input transistor to a gate terminal of the second transistor of the second comparator.

64. The method of claim 63 further including the step of generating a reference current in the current mirror input transistor.

65. The method of claim 64 wherein the step of generating a reference current comprises the steps of connecting a reference transistor in series with the current mirror input transistor and applying a reference voltage equal in magnitude to the first threshold voltage across gate-source terminals of the reference transistor.

66. The method of claim 65 wherein the first and second threshold voltages are of equal magnitude.

* * * * *